US010025896B2

(12) United States Patent
Azriel et al.

(10) Patent No.: US 10,025,896 B2
(45) Date of Patent: Jul. 17, 2018

(54) EXPLOITING THE SCAN TEST INTERFACE FOR REVERSE ENGINEERING OF A VLSI DEVICE

(71) Applicant: Technion Research & Development Foundation Limited, Haifa (IL)

(72) Inventors: Leonid Azriel, Haifa (IL); Abraham Mendelson, Haifa (IL); Ran Ginosar, Nofit (IL)

(73) Assignee: Technion Research & Development Foundation Limited, Haifa (IL)

( * ) Notice: Subject to any disclaimer, the term of this patent is extended or adjusted under 35 U.S.C. 154(b) by 94 days.

(21) Appl. No.: 15/145,988

(22) Filed: May 4, 2016

(65) Prior Publication Data
US 2016/0328509 A1 Nov. 10, 2016

Related U.S. Application Data

(60) Provisional application No. 62/156,391, filed on May 4, 2015.

(51) Int. Cl.
*H02J 7/00* (2006.01)
*G06F 17/50* (2006.01)

(52) U.S. Cl.
CPC ...... *G06F 17/5045* (2013.01); *G06F 2217/14* (2013.01)

(58) Field of Classification Search
CPC ........ G06F 11/26; G06F 11/27; G06F 17/505; G06F 17/5022; G06F 17/5045; G06F 2217/14; G01R 31/2851; G01R 31/317
USPC .......................... 716/104, 136; 714/716–727
See application file for complete search history.

(56) References Cited

U.S. PATENT DOCUMENTS

| 6,182,268 | B1 | 1/2001 | McElvain |
| 7,353,470 | B2 * | 4/2008 | Cooke ............ G01B 31/318552 716/106 |
| 2007/0061644 | A1 * | 3/2007 | Birmiwal ....... G01R 31/318583 714/726 |

(Continued)

OTHER PUBLICATIONS

Subramanyan et al. "Reverse Engineering Digital Circuits Using Functional Analysis", Proceedongs of the Conference on Design, Automation & Test in Europe, EDA Consortium, Grenoble, France, Mar. 18-22, 2013, p. 1277-1280, Mar. 18, 2013.

(Continued)

*Primary Examiner* — Paul Dinh

(57) ABSTRACT

A computerized method of creating a circuit logic model of a VLSI device, comprising mapping a plurality of logic function patterns of one or more circuits of a VLSI device through a plurality of probe iterations and generating a circuit logic model of the circuit(s) by reconstructing a logical function of a combinatorial logic of the circuit(s) based on analysis of the logic function patterns. Each of the probe iteration comprises switching between scan shift mode and functional mode of the VLSI device such that while the VLSI device operates in scan shift mode register(s) associated with the circuit(s) is accessed and while the VLSI device operates in functional mode external pin(s) of the VLSI device associated with the circuit(s) is probed and mapping a respective one of the logic function patterns according to a logic state of one or more bits in the register(s) and/or the external pin(s).

19 Claims, 11 Drawing Sheets

(56) References Cited

U.S. PATENT DOCUMENTS

2013/0275824 A1* 10/2013 Tekumalla ..... G01R 31/318536
714/726
2014/0047293 A1* 2/2014 Lamb ..................... G01R 31/27
714/727

OTHER PUBLICATIONS

Torrance et al. "The State-of-the-Art in IC Reverse Engineering", Proceedings of the 11th International Workshop on Cryptographic Hardware and Embedded Systems, CHES'09, p. 363-381, Aug. 30, 2009.

Wegener "The Complexity of Boolean Functions", Wiley-Teubner Series in Computer Science, 1: 1-458, 1987.

Yang et al. "Secure Scan: A Design-for-Test Architecture for Crypto Chips", IEEE Transactions on Computer-Aided Design of Integrated Circuits and Systems, 28(10): 2287-2293, Oct. 2008.

Corno et al. "RT-Level ITC'99 Benchmarks and First ATPG Results", IEEE Design & Test of Computers, 17(3): 44-53, Jul. 2000.

Da Rolt et al. "New Security Threats Against Chips Containing Scan Chain Structures", HOST'11, IEEE International Symposium on Hardware-Oriented Security and Trust, San Diego, CA, USA, Jun. 5-6, 2011, p. 105-110, Jun. 2011.

Da Rolt et al. "Thwarting Scan-Based Attacks on Secure-ICs With On-Chip Comparison", IEEE Transactions on Very Large Scale Integration (VLSI) Systems, 22(4): 947-951, Published Online May 2013.

Das et al. "Security Analysis of Industrial Test Compression Schemes", IEEE Transactions on Computer-Aided Design of Integrated Circuits and Systems, 32(12): 166-1977, Nov. 19, 2013.

Hely et al. "Scan Design and Secure Chip", Proceedings of the 10th IEEE International On-Line Testing Symposium, IOLTS 2004, Madeira Island, Portugal, Jul. 12-14, 2004, 4: 219-224, Jul. 12, 2004.

Hely et al. "Security Challenges During VLSI Test", 2011 IEEE 9th International New Circuits and Systems Conference, NEWCAS, Bordeaux, France, Jun. 26-29, 2011, p. 486-489, Jun. 26, 2011.

Hely et al. "Test Control for Secure Scan Designs", Proceedings of the 18th IEEE European Test Symposium, ETS'05, Tallinn, Estonia, May 22-25, 2005, p. 190-195, May 2005.

Lee et al. "Securing Designs Against Scan-Based Side-Channel Attacks", IEEE Transactions on Dependable and Secure Computing, 4(4): 325-336, Oct. 2007.

Li et al. "Reverse Engineering Circuits Using Behavioral Pattern Mining", IEEE International Symposium on Hardware-Oriented Security and Trust, HOST'12, San Francisco, CA, USA, Jun. 3-4, 2012, p. 83-88, Jun. 3, 2012.

Lupanov "On Circuits of Functional Elements With Delay", Problemy Kibernetiki, 23: 43-81, 1970.

Nohl et al. "Reverse-Engineering A Cryptographic RFID Tag", Proceedings of the 17th USENIX Security Symposium, San Jose, CA, USA, Jul. 31, 2008, p. 185-193, Jul. 2008.

Shi et al. "A Highly Efficient Method for Extracting FSMs From Flattened Gate-Level Netlist", Proceedings of the 2010 IEEE International Sympoium on Circuits and Systems, Paris, France, May 30-Jun. 2, 2010, p. 2610-2613, May 30, 2010.

* cited by examiner

EXPLOITING THE SCAN TEST INTERFACE FOR REVERSE ENGINEERING OF A VLSI DEVICE

RELATED APPLICATION

This application claims the benefit of priority under 35 USC 119(e) of U.S. Provisional Patent Application No. 62/156,391 filed on May 4, 2015, the contents of which are incorporated herein by reference in their entirety.

REFERENCES CITED

Materials incorporated by reference in this disclosure include the following: 1. Como, F., Reorda, M. S., Squillero, G.: RT-level ITC'99 benchmarks and first ATPG results. IEEE Des. Test Comput. 17, 44-53 (2000).

FIELD AND BACKGROUND OF THE INVENTION

The present invention, in some embodiments thereof, relates to generating a circuit logic model for one or more circuits of a VLSI device and, more specifically, but not exclusively, to generating a circuit logic model for one or more circuits of a VLSI device using a scan test interface of the VLSI device.

Reconstructing a circuit logic model, for example, by reverse engineering of a very large scale integration (VLSI) device is a complex task that may require tedious work and expensive equipment. The ultimate goal of the circuit logic model reconstruction is, given the physical VLSI device, to discover its underlying algorithm, in other words, the device's behavioral definition, i.e. logical functionality. The circuit logic model reconstruction may be regarded as a two-stage process where the circuit description is first extracted from the physical VLSI device and then a behavioral model is extracted from the circuit description. While the second stage involves mainly algorithms and computation, the first stage may involve complex and/or costly processes and/or equipment.

Scan insertion algorithm(s) is a well-known design for testability (DFT) technique that allows automatic generation of test vectors for production test of the VLSI device. Scan insertion has become widely used due to its efficiency and ability to achieve high coverage testing of the VLSI device circuits. The scan insertion algorithm adds to the VLSI device a special shift mode in which the internal registers of the VLSI device are arranged in one or more shift registers, called scan chains.

SUMMARY OF THE INVENTION

According to some embodiments of the present invention, there is provided a computerized method of creating a circuit logic model of a very large scale integration (VLSI) device, comprising:

Mapping a plurality of logic function patterns of one or more circuits of a VLSI device through a plurality of probe iterations, each probe iteration comprising:

Switching between a scan shift mode and a functional mode of the VLSI device such that while the VLSI device operates in the scan shift mode one or more registers associated with the one or more circuits are accessed, and while the VLSI device operates in the functional mode one or more external pins of the VLSI device associated with the one or more circuit are probed.

Mapping a respective one of the plurality of logic function patterns according to a logic state of one or more bits in the one or more registers and the one or more external pins.

Generating a circuit logic model of the one or more circuits by reconstructing a logical function of a combinatorial logic of the one or more circuits based on an analysis of the plurality of logic function patterns.

The mapping includes creating a truth table comprising the plurality of logic function patterns.

The number of said plurality of probe iterations depends on a number of a plurality of test vectors each comprising a sequence of logic states of one or more bits in the one or more registers and/or one or more external input pin of the one or more external pins. The number of the plurality of test vectors is bound by a maximal number being a sum of a number of bits in said at least one register and a number of external input pins of said at least one external pin.

The access to the one or more registers includes setting a logic value to the one or more bits in the register and/or reading a logic value of the one or more bits. The setting and the reading is done through a scan test interface of the VLSI device.

The setting is done by driving a register input vector including a number of bits equal to a number of the one or more bits and the reading is done by retrieving a register output vector including a number of bits equal to a number of the one or more bits.

The probe of the one or more external pins includes setting a logic value to one or more external input pin of the one or more external pins and reading a logic value of one or more external output pin of the one or more external pins.

The setting is done by applying an input vector including a number of bits equal to a number of the one or more external input pins and the reading is done by probing an output vector including a number of bits equal to a number of the one or more external output pin.

Optionally, the number of the plurality of probe iterations is reduced by reducing a number of a plurality of test vectors each applied to the VLSI device during a respective one of the plurality of probe iterations. Each test vector comprises a sequence of logic states of one or more of the one or more bit and/or one or more of the external input pins. The number of the plurality of test vectors is reduced by selecting selected test vectors from the plurality of test vectors having a Hamming weight lower than a maximal Hamming weight defining a number of bits that are not equal to zero. The maximal Hamming weight implies a precision level of the circuit logic model.

Optionally, the number of the plurality of probe iterations is reduced by applying an incremental Hamming weight to the plurality of test vectors.

Optionally, the number of the plurality of probe iterations is reduced by selectively expanding a limited number of significant test vectors of the plurality of test vectors. The significant test vectors present a significant logic function pattern during one or more previous probe iterations of the plurality of probe iterations.

Optionally, computation resources for said analysis are reduced by considering each of the plurality of logic functional patterns only in case the logic function pattern is a minterm having a result value of (logic) "1".

Optionally, the computation resources for the analysis are reduced by removing one or more redundant logic function patterns of the plurality of logic function patterns. The one or more redundant logic function patterns provide no additional information on the logic function over information provided by one or more previous logic function patterns created during one or more previous probe iterations of the plurality of probe iterations.

According to some embodiments of the present invention, there is provided a system for generating a circuit logic model of a VLSI device, comprising a probe connected to a scan test interface of a VLSI device, a program store for storing a code and one or more processors coupled to the probe and the program store for executing the code. The code comprises:

Code instructions to map a plurality of logic function patterns of one or more circuits of the VLSI device through a plurality of probe iterations, each probe iteration comprising:

Switching between a scan shift mode and a functional mode of the VLSI device such that while the VLSI device operates in the scan shift mode one or more registers associated with the one or more circuits are accessed, and while the VLSI device operates in the functional mode one or more external pins of the VLSI device associated with the one or more circuit are probed.

Mapping a respective one of the plurality of logic function patterns according to a logic state of one or more bits in the one or more registers and the one or more external pins.

Code instructions to generate a circuit logic model of the one or more circuits by reconstructing a logical function of a combinatorial logic of the one or more circuits based on an analysis of the plurality of logic function patterns.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
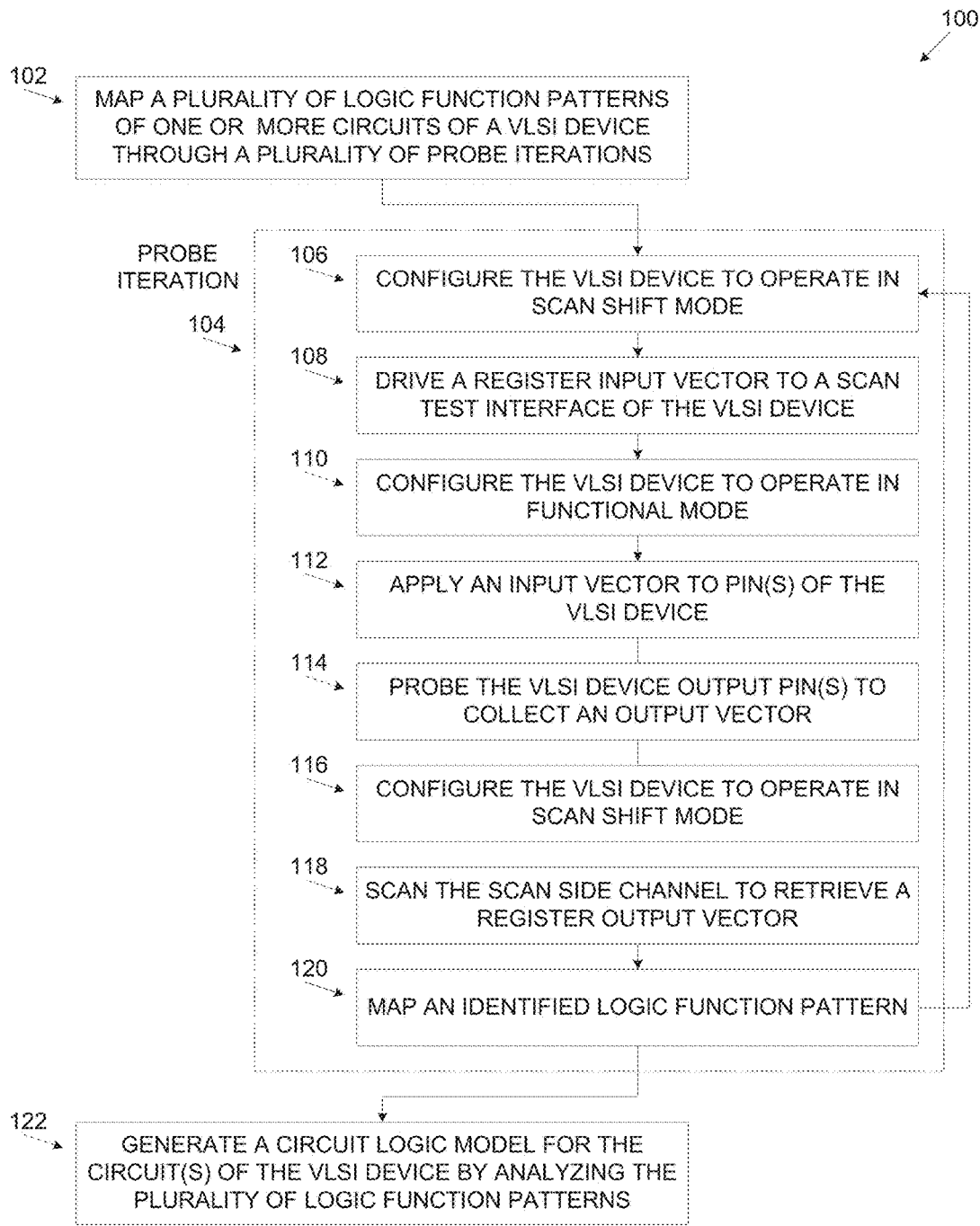
FIG. 1 is a flowchart of an exemplary process for generating a circuit logic model for one or more circuits of a VLSI device using a scan test interface of the VLSI device, according to some embodiments of the present invention.

The present invention, in some embodiments thereof, relates to generating a circuit logic model for one or more circuits of a VLSI device and, more specifically, but not exclusively, to generating a circuit logic model for one or more circuits of a VLSI device using a scan test interface of the VLSI device.

According to some embodiments of the present invention, there are provided methods and systems for creating a circuit logic model of digital VLSI devices by manipulating the VLSI device in both a scan shift mode and an operational mode to reconstruct a logical functional model of the VLSI device exploiting a scan test interface of the VLSI device. The reconstruction of the circuit logic model is takes advantage of the ability to switch the VLSI device between the scan shift mode and the functional (operational) mode. A scan insertion algorithm is employed while the VLSI device is set in the scan shift mode to drive (shift in) and retrieve (shift out) data vectors for setting internal register(s) of the VLSI device to a desired state and reading register(s) state. The scan insertion algorithm is coupled with applying a logic state to external input pin(s) of the VLSI device while in the operational mode and probing one or more external output pins of the VLSI device. Generating the circuit logic model is based on mapping a plurality of logic function patterns, for example, creating a truth table of the circuit(s) and analyzing the logic function patterns to identify a logical function of a combinatorial logic of the VLSI device circuit(s). Mapping the logic function patterns is done by searching possible state (logic state, i.e. "0" or "1") combinations of external input pins associated with the circuit(s) of the VLSI device, internal registers associated with the circuit(s) and/or external output pins associated with the circuit(s). The logic function patterns are identified and logged through a plurality of probe iteration during which the VLSI device is switched between a scan shift mode and a functional (operational) mode. When configured to the scan shift mode, the VLSI device is capable to receive (shift in) and/or transmit (shift out) state data of one or more bits in one or more of the internal registers through the scan test interface. This means that through the shift in, the internal register(s) may be placed in desired state and the state of the internal register(s) may be sampled (retrieved) using the shift out. When configured to the functional mode, the VLSI device operates normally according to the logic functionality of its circuit(s).

During each of the probe iterations the VLSI device is configured to operate in scan shift mode, one of a plurality of register input vectors is driven into one or more scan chains of the VLSI device that are accessible through the scan test interface. Each register input vector sets the state of respective one or more bits in the register(s). Once the register input vector is injected, the VLSI device is switched to functional mode and one of a plurality of input vectors is applied set the state of one or more input pins associated with the circuit(s). One or more output pins associated with the circuit(s) are probed to retrieve a respective output vector representing the state of the output pin(s). The VLSI device is then switched back to the scan shift mode and a respective register output vector is retrieved that indicates the state of the respective bit(s) in the register(s). The probe iterations are repeated for all applicable vectors of the input vectors and the register input vectors. After mapping the logic function patterns is finished, they are analyzed to identify a logic function of the combinatorial logic of the circuit(s) and the circuit logic model is created.

Optionally, one or more heuristic algorithms are applied during generation of the circuit logic model to reduce computation resources. The heuristic algorithms are applied may be applied during the logic function patterns mapping. The heuristic algorithms take advantage of a limited transitive fan-in property typical to the VLSI device to reduce complexity of the circuit logic model construction and/or to expedite generation of the circuit logic model. The heuristic algorithms may include, for example, reducing the number of the probe iterations by reducing the number of the plurality of input vectors and/or the number of the plurality of register input vectors. The heuristic algorithms may further include, reducing the number of logic function patterns that are analyzed by removing redundant entries. A metric of reconstruction accuracy of the circuit logic model may be defined and calculated to indicate the accuracy of the generated circuit logic model, specifically with dependency on the used heuristic algorithm(s).

The systems and methods presented herein the present invention for generating a circuit logic model of the VLSI device may present significant advantages compared to currently existing methods for reconstructing a logic functionality map of the VLSI device. As opposed to the currently existing methods, the present invention for generating a circuit logic model of the VLSI device combines the scan insertion algorithm while the VLSI device is in scan shift mode with probing the VLSI device in functional mode. The presented systems and methods take advantage of the VLSI device scan test interface and are therefore non-invasive meaning there is no need for invasive operations to the VLSI device, for example, packaging removal, cross-section, delayering and/or nanoscale imaging as may be used by the currently existing methods. There is therefore no need for special and likely expensive equipment and/or processes for unfolding the sequential logic functionality and simple, standard and/or off the shelf equipment may be used.

Moreover, identifying the vulnerability of the VLSI device exposed by exploiting the scan test interface may allow VLSI devices designers and/or manufacturers to improve protection of the content of the VLSI devices that may include sensitive intellectual property (IP) and/or confidential information, for example encryption keys and/or the like.

Furthermore, the heuristic algorithms applied during generation of the circuit logic model of the VLSI device may significantly reduce computation resources, for example, computation time and/or computation load. Searching through the entire space of possible combinations of the states of the internal registers and the external input pins may involve severe effort and/or resources and may even be impractical, specifically for large-scale VLSI devices. Reducing the logic function patterns number and/or the analysis complexity may significantly reduce the required resources and/or costs for generating the circuit logic model.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product.

Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference is now made to FIG. 1, which is flowchart of an exemplary process for generating a circuit logic model for one or more circuits of a VLSI device using a scan test interface of the VLSI device, according to some embodiments of the present invention. A process 100 combines a scan insertion algorithm in which a scan test interface of the VLSI device and probing the VLSI device in functional (operational) mode. The process 100 is executed to generate a circuit logic model for one or more circuits of the VLSI device by mapping logic function patterns of the circuit(s), for example, a truth table and analyzing the logic function patterns to identify a logical function of the combinatorial logic of the VLSI device circuit(s). The logic function patterns mapping is done through a plurality of probe iteration in which the VLSI device is switched between scan shift mode and functional mode. During the scan shift mode phase, a scan insertion algorithm is used to drive a plurality of register input vectors into the VLSI device to set and/or read one or more bits of one or more internal registers of the VLSI device associated with operation of the circuit(s). During the functional mode phase a plurality of input vectors are applied to one or more external input pins of the VLSI device associated with operation of the circuit(s). One or more external output pins are probed to retrieve their logic state. Based on the logic state of the input pin(s), the register(s) bit(s) and the output pin(s) a detected logic function pattern may be mapped. After mapping the logic function patterns, they are analyzed to identify and create a logical function representing a logic functionality of a combinatorial logic of the circuit(s).

Figure 2:
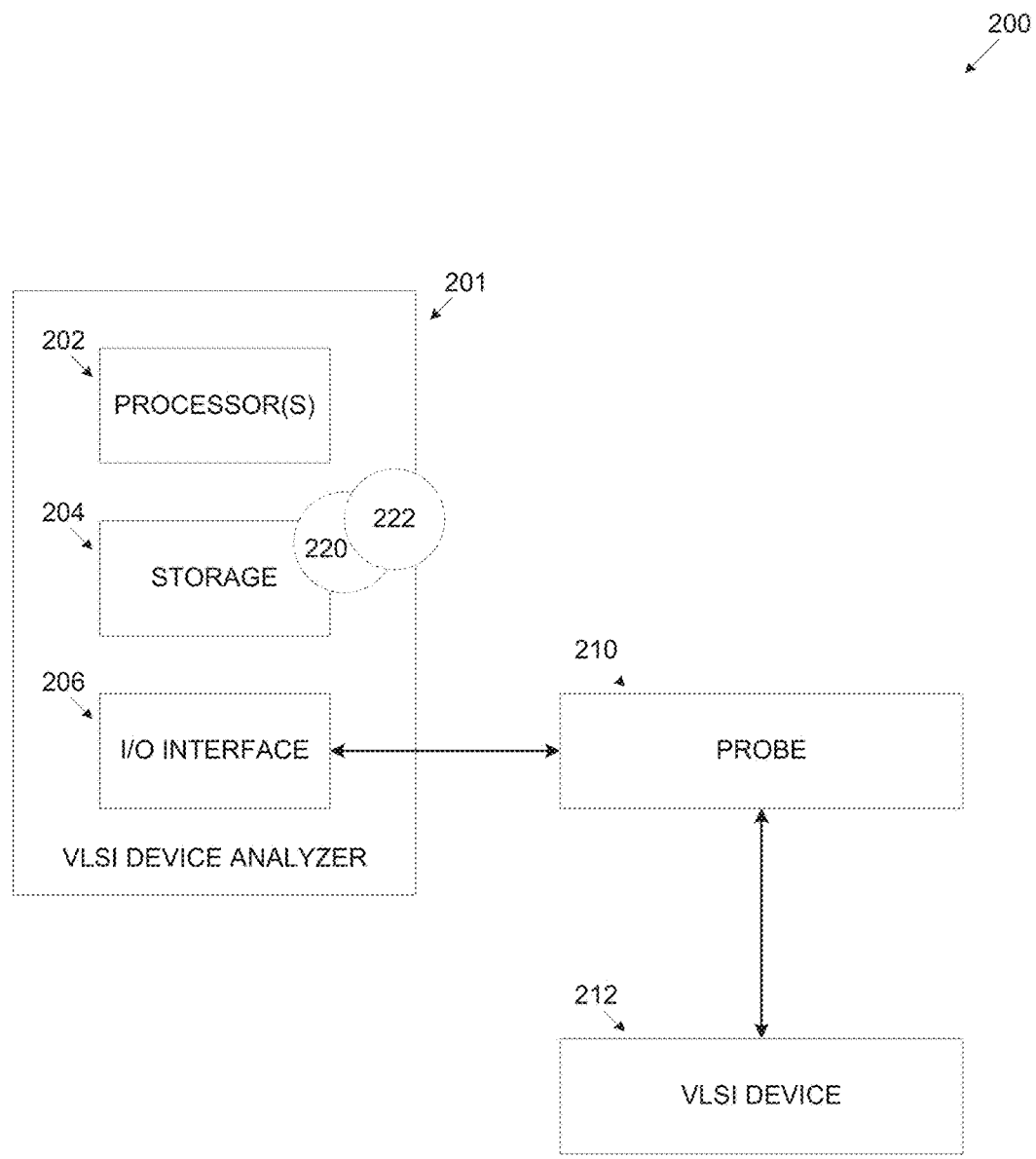
FIG. 2 is a schematic illustration of an exemplary system for generating a circuit logic model for one or more circuits of a VLSI device using a scan test interface of the VLSI device, according to some embodiments of the present invention.

Reference is also made to FIG. 2, which is a schematic illustration of an exemplary system for generating a circuit logic model for one or more circuits of a VLSI device using a scan test interface of the VLSI device, according to some embodiments of the present invention. A system 200 includes a VLSI device analyzer 201 comprising a processor(s) 202 for executing a process such as the process 100, a storage 204 and an input/output (I/O) interface 206 for interfacing a probe 210 that connects to a VLSI device 212. The processor(s) 202, homogenous or heterogeneous, may be arranged for parallel processing, as clusters and/or as one or more multi core processor(s). The storage 204 may include one or more non-transitory, non-volatile devices, for example, a hard drive, a Flash array and the like. The storage 204 may further comprise one or more network storage devices. The storage 204 may perform as a program store for storing one or more software modules implementing the process 100, for example, a probing module 220 and/or a model generator 222. Wherein a software module refers to a plurality of program instructions stored in a non-transitory medium such as the storage 204 and executed by a processor such as the processor(s) 202. The I/O interface(s) 206 may include one or more interfaces for communicating with the probe 210, for example, a local area network (LAN), a wireless LAN, a universal serial bus (USB), a serial port, a radio frequency (RF) interface and/or the like. The probe 210 is capable to connect to the VLSI device 212 to, provide power to the VLSI device 212, apply an appropriate voltage level to set a state (logic state) to the VLSI device external input pin(s) and probe the VLSI device external output pin(s) to read the voltage level indicating the state of the output pin(s). The probe 210 may include, for example, a bed of nails, a socket and/or the like to allow access to the external pins of the VLSI device 212. The probe further allows access to the scan test interface of the VLSI device 212, for example, a boundary scan port, a joint test action group (JTAG IEEE 1149.1) port, a port compliant with IEEE 1149.6, IEEE 1149.8.1, IEEE 1532 and/or IEEE 1149.4 and/or the like. Through the scan test interface the probe 210 is capable of driving (shift in) register input vectors for setting one or more bits of one or more registers of the VLSI device 212 and/or reading (shift out) register output vectors indicating the state of the bit(s) of the register(s). The probe 210 is capable of configuring the VLSI device 212 to operate in the scan shift mode and the functional mode, for example, by applying a predefined logic state to one or more external pins of the VLSI device 212. The probe 210 may further include one or more processors such as the processor(s) 202 and a storage such as the storage 204 to store and execute one or more software modules to receive commands and/or data from the VLSI device analyzer 201 and apply them to the VLSI device 212 and/or vice versa.

Figure 3:
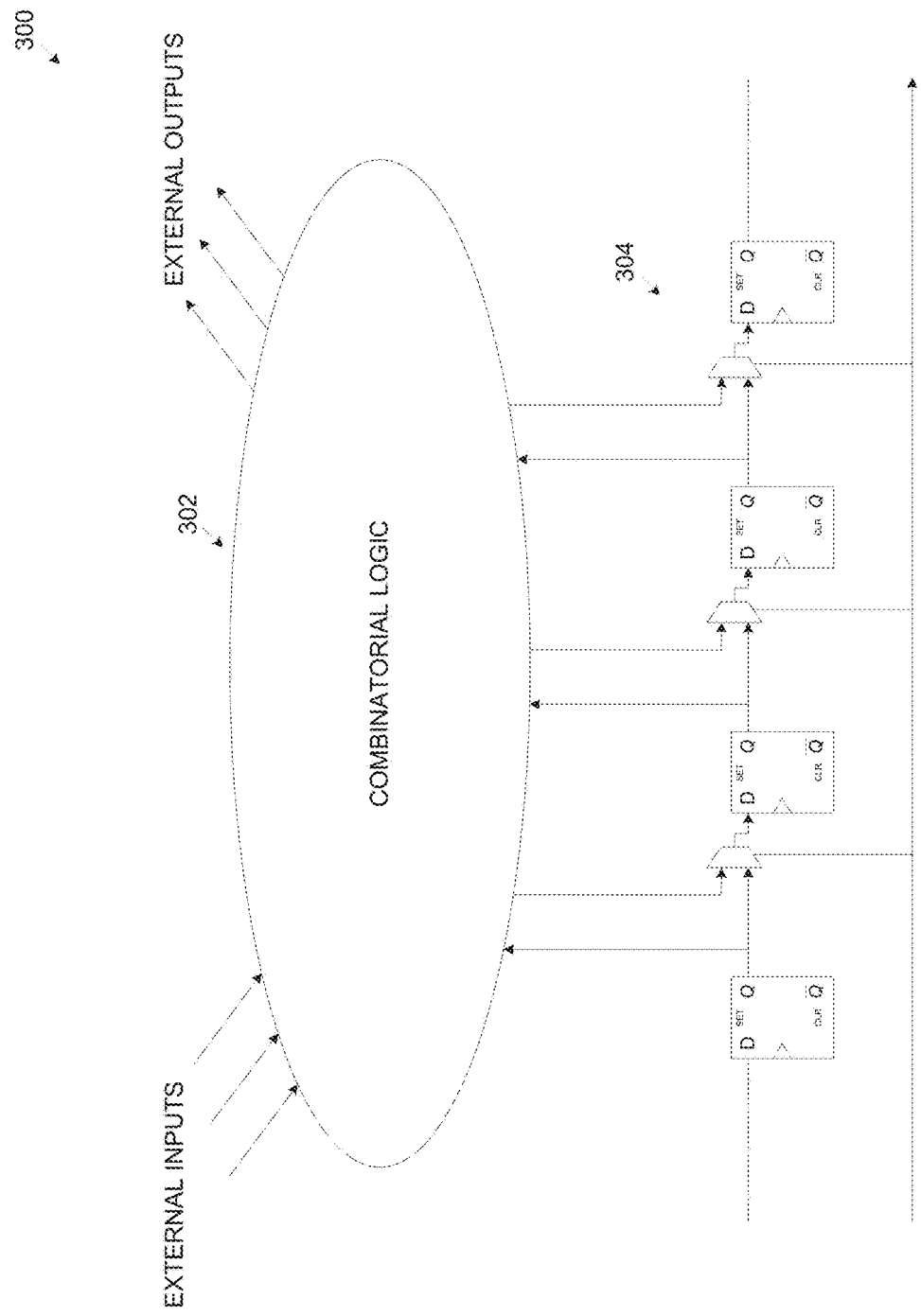
FIG. 3 is a schematic illustration of a conceptual interaction model of a probe with a VLSI device.

Reference is now made to FIG. 3, which is a schematic illustration of a conceptual interaction model of a probe with a VLSI device. A probe such as the probe 110 is hosting and/or connecting to a VLSI device to provide a circuit interface to one or more circuits for which the circuit logic model is created. The circuit interface includes providing power to the VLSI device 212, setting a (logic) state to one or more external input pins of the VLSI device 212 and probing the (logical) state of one or more output pin(s) of the VLSI device 212. The probe 210 is further capable to connect to a scan test interface of the VLSI device 212 to access one or more built in logic chains (scan chains) 304. Using the scan chain(s) 304 the probe 210 may drive (shift in) register input vectors for setting one or more bits of one or more registers of the VLSI device 212 and/or read (shift out) register output vectors indicating the state of the bit(s) of the register(s). The probe 210 may allow access to the external input pin(s), the external output pin(s) and/or the register(s) associated with one or more circuits of the VLSI device 212 to probe a logical functionality of a combinatorial logic 302 of the circuit(s).

Reference is made once again to FIG. 1. First, as shown at 102, the process 100 for generating a circuit logic model for one or more circuits of the VLSI device 212 starts with the probing module 220 mapping a plurality of logic function patterns of the circuit(s) by probing the circuit(s) through a plurality of probe iterations 104. With each iteration 104 the probing module identifies another logic function pattern and maps and/or logs it accordingly.

During each iteration the probing module 220 (using the probe 210) executes the following sequence:

Set the VLSI device 212 in the scan shift mode.

Drive (shift in) a respective one of a plurality of register input vectors to the scan test interface of the VLSI device 212 (using the probe 210) to set bit(s) in one or more internal registers associated with the circuit(s).

Set the VLSI device 212 (using the probe 210) in the functional mode.

Apply a respective one of a plurality of input vectors to the external input pin(s) associated with the circuit(s).

Probe (using the probe 210) the state of one or more external output pins associated with the circuit(s).

Set the VLSI device 212 in the scan shift mode.

Collect the state of the bit(s) in the internal register(s).

Map and/or log the logic functional pattern identified during the current iteration 104.

Each of the register input vectors includes a sequence of logic states ("0" or "1") for setting respective bit(s) in the register(s) associated with the circuit(s). The total number of logic states in the sequence corresponds to the total number of bits in the register(s). Similarly, each of the input vectors includes a sequence of the logic states for configuring respective external input pin(s) associated with the circuit(s). The total number of logic states in the sequence corresponds to the total number of associated external input pins. The register input vectors and the input vectors may be considered as test vectors applied to the VLSI device during each of the probe iterations 104.

During each probe iteration 104 one of the test vectors is used to set the bit(s) in the register(s) and the input pin(s).

The test vectors comprising the input vectors and the register input vectors may be created in advance, for example, a complete set of all possible combinations of the vectors and/or a subset comprising selected vectors. Optionally, the vectors are selected adaptively during the iterative process 100. For example, while most test vectors do not yield significant understanding of the logic functionality of the circuit(S), the probing module 220 may identify one or more test vectors used during previous probe iteration(s) 106 that presented a significant contribution to identifying the logic function patterns. The probing module 220 may expand the identified test vectors as it estimates the expansion of the identified test vectors will also provide significant logic function patterns.

As shown at 106, the probing module 220 configures the VLSI device to operate in scan shift mode, for example, by instructing the probe 210 to configure the VLSI device 212 to operate in the scan shift mode. In the scan shift mode, the VLSI device allows access to one or more built in scan chains through which the internal registers are accessible.

As shown at 108, the probing module 220 drives (shift in) a respective one of the register input vectors on the scan chain(s) through the scan test interface. The register input vector comprises state values for setting the bit(s) of the internal register(s) associated with the circuit(s).

As shown at 110, the probing module 220 configures the VLSI device to operate in functional (operational) mode, for example, by instructing the probe 210 to configure the VLSI device 212 to operate in the functional mode. In the functional mode, the VLSI device operates normally executing its internal combinatorial logic to the drive the state of the output pin(s) according to the state of the register(s) vector and/or the state of the input pin(s).

As shown at 112, the probing module 220 applies a respective one of the input vectors. The input vector comprises state values for setting the input pin(s) associated with the circuit(s).

As shown at 114, the probing module 220 retrieves a respective on of a plurality of output vectors by probing the (logic) state of the output pin(s) associated with the circuit(s). The output vector comprises state(s) of the output pin(s) associated with the circuit(s).

As shown at 116, the probing module 220 configures once again the VLSI device to operate in the scan shift mode.

As shown at 118, the probing module 220 reads (shift out) a respective one of a plurality of register output vectors through the scan test interface. The register output vector comprises the state of the bit(s) of the internal register(s) associated with the circuit(s).

As shown at 120, the probing module identifies one or more logic function pattern identified during the current iteration 104.

As shown at 122, after all the applicable input vectors and register input vectors are applied to the circuit(s) the model generator 222 analyzes the plurality of logic function pattern to reconstruct one or more logic functions of the combinatorial logic of the circuit(s). Based on the reconstruction the model generator 22 generates the circuit logic model for the circuit(s).

The process 100 is straight forward however it may be applicable and/or practical for relatively small VLSI device and/or circuits comprising no more than a few dozens of registers. To overcome this, the probing module 220 may apply several heuristic algorithms to make the process 100 applicable for complex large-scale VLSI device and/or circuits. The basis for applying the heuristic algorithms described herein after is a property of typical digital where the transitive fan-in is limited.

For a given number of inputs (input pins) n, the number of Boolean functions realizable by a digital circuit is significantly smaller than $2^{2^n}$ that is the total number of possible functions. This assertion is a direct corollary from the Shannon Effect which states that "almost all' Boolean functions have a complexity close to the maximum possible for the uniform probability distribution, namely an arbitrary function with n variables will have asymptotic complexity of $O(2^n)$ (big O notation commonly associated with asymptotic computational complexity) with probability close to "1". The Boolean function is equivalent to circuit complexity (the number of gates). Therefore, for a large n, a circuit of size of $O(2^n)$ is not realizable. This leads to a conclusion that that for a large n, almost all Boolean functions are not realizable by a digital circuit proving the assertion made above. By applying the heuristically algorithms that are based on the limited transitive fan-in property of the circuit(s) the complexity of the circuit logic model generation may be significantly reduced.

To demonstrate the construction of the logic functions and the circuit logic model a digital logic circuit is defined as shown in definition 1 below:

Definition 1

Let S be a digital circuit comprising:

| A vector of inputs (input pins) | $i = (i_1, \ldots, i_a) \in \{0, 1\}^a$ |
|---|---|
| A vector of outputs (output pins) | $o = (o_1, \ldots, o_b) \in \{0, 1\}^b$ |
| A state register(s) (internal register(s)) | $r = (r_1, \ldots, r_n) \in \{0, 1\}^n$ |
| A clock input | $ck \in \{0, 1\}^n$ |

And a collection of combinational gates that implement the next state and output function F such that $(r\backslash o)_{next\_ck\_cycle} = F(r\backslash i)$.

The probing module 220 employs the scan insertion algorithm for injecting the input vectors and/or the register input vectors and retrieving the output vectors and/or the register output vectors. The scan insertion algorithm applied arranges the bits of an internal state register(s) r in c scan chains controlled and observable from the circuit interface. As described before, during the process 100, the probing module 220 switches the circuit operation between the functional mode and the scan shift mode. For brevity, the description of the additional logic controlling the scan chains is omitted from the formal definition of the circuit and it is assumed that the internal registers r may be set and observed (retrieved) at once. For the computation time however, it is noted that the complete probe operation performed during each iteration 104 takes 2n/c+1 clock cycles. This is due to n (n bits in the register r) clock cycles are required for driving the register input vector (shift in), one clock cycle for applying the input vector and collecting the output vector and additional n click cycle for retrieving (shift out) of the register(s) r. The n clocks for shift in and shift out are divided by the number of scan chain c available in the VLSI device since they may be accessed concurrently. For large n (complex VLSI devices) it is assumed that c is constant and therefore c<<n. The probe operation Probe(S,v) such as the probe iterations 104 over the circuit S using a vector v comprising the register input vector and the input vector may therefore be defined as the following pseudocode sequence:

(1) r||i := v
(2) $o_{n-1}$ := o
(3) Capture
(4) Return r||$o_{n-1}$

Some additional definitions are set herein in definition 2 for later use.

Definition 2

An implicant of the function F is a minterm, for which the value of F is "1".

A literal is a variable in the minterm. A literal is negative if it appears with a negation sign and is positive otherwise.

An irredundant literal with respect to a function F is a literal that corresponds to a variable that affects the value of F. Otherwise, the literal is redundant.

A minterm m is a reduction (rdc) of a minterm m', if m can be obtained by removing literals from m'. In such case the minterm m' is an expansion of m.

The binary vector v is converted to a minterm m by mapping bits in v that equal to "1" to positive literals in m and bits that equal to 0 to negative literals in m.

Naturally, the probing module 220 may execute an exhaustive search over all possible test vectors comprising the input and/or register input vectors. This search may be referred to as exhaustive search over truth table algorithm (ESoTT). The term truth table as used for the ESoTT refers to the entire space of possible combinations of bits in the input vectors and the register input vectors. Given the digital circuit S compliant with the definition 1 the ESoTT algorithm is applied using the pseudo code excerpt 1:

Pseudocode Excerpt 1:

for v from 0 to $2^{n+a} - 1$ do:
   TT[v] := Probe(S, v)
endfor

The array TT contains the truth table of the function F at the end of the ESoTT algorithm execution. This directly follows from the definitions of the circuit and the ESoTT algorithm. The run time T of the ESoTT algorithm expressed in equation 1 below is proportional to the number of steps multiplied by the length of the scan chains. The cumulative number of register bits and input bits determines the search space for the function F. Throughout the present invention the notation N is used for designating the cumulative number where N=n+a. The space (memory and/or storage) S the ESoTT algorithm occupies as expressed in equation 2 is proportional to the size of the array TT.

$$T_{ESoTT} \sim O\left[\left(\frac{2n}{c} + 1\right)2^{n+a}\right] \quad \text{Equation 1}$$

$$S_{ESoTT} \sim O[(n+b)2^{n+a}] \quad \text{Equation 2:}$$

The runtime complexity may be obtained by counting the probe iterations 104 (i.e. the number of input vector plus the number of the register input vectors). The probe operations are the computation consuming operations requiring extended computation time and/or extensive computation resources. The processing time of the probe iterations 104 executed by the probing module 220 is linearly dependent on n and the probe iterations 104 must run serially. The processing performed by the model generator 222 on the other hand may run in parallel to the iterations 104.

Optionally, the model generator 222 is executed using one or more processors such as the processor(s) 202 to analyze the plurality of logic function patterns concurrently. The complexity of the ESoTT algorithm is therefore determined by the number of probe iterations 104.

As discussed before, in case the probing module 220 and the model generator 222 execute the ESoTT algorithm extreme computation resources may be required that may lead the process 100 to be impractical for large-scale VLSI devices and/or circuits.

To overcome this drawback, one or more heuristic algorithm may be employed by the probing module 220 and/or the model generator 222.

The first heuristic algorithm introduced is a K-bound search over truth table algorithm (KSoTT) in which only a subset of Boolean functions may be realized by the circuit(s) for which the circuit logic model is created through the process 100. While the ESoTT algorithm operates over an arbitrary Boolean functions B where B is defined as B:$\{0,1\}^{n+a} \rightarrow \{0,1\}^{n+a}$ the KSoTT algorithm operates over a subset $B_K$ such that every bit in the Boolean function depends on no more than $K_{max}$ bits of the in the input of the Boolean function. Given the digital circuit S compliant with the definition 1, two process are executed by the KSoTT algorithm performs is executed in two stages—a learning stage and a post-process stage as expressed in a pseudocode excerpt 2 below.

---

Pseudocode Excerpt 2:

Stage 1 - the learning stage:
    $F_0$ = Probe(S, 0)
    for each v ∈ $\{0,1\}^{n+a}$ | HammingWeight(v) ∈ (1, ..., $K_{max}$):
        P := Probe(S, v) ⊗ $F_0$
        for each i | $P_i$ = 1: Record tuple < v, i > in TT
    endfor
Stage 2 - the post-process to eliminate redundant literals:
    Stage 2a:
    for i from 1 to (n + b)andl from 1 to (n + a)
        if ∀v | < v, i >∈ TT: < (v\\$v_j$) ∪ ¬ $v_j$ , i >∈ TT
            remove literal $v_j$ from all tuples < v, i >
    endfor
    Stage 2b:
    for each < v, i >∈ TT | HammingWeight(v) = $K_{max}$
        if ∀v | < v, i >∈ TT: < (v\\$v_j$) ∪ ¬ $v_j$ , i >∈ TT
            remove all negative literals from v
    endfor

---

Where the Probe(S, 0) function represents a probe iteration such as the probe iteration 106.

If the circuit S implements F∈$B_K$, the truth table TT will contain all and only implicants of all the output bits in the function F ⊗ $F_0$ thus the truth table IT is sufficient for full reconstruction of the function F as proved in the following section.

The proof is first directed at proofing the correctness of the KSoTT algorithm for a function F for which F(0)=0. Let f be a circuit reconstruction function resulting from the truth table TT. The KSoTT algorithm is correct if $f_i(v)=F_i(v)$ for every input vector v∈$\{0,1\}^{n+a}$ and every output bit 1≤i≤n+b.

The proof is made for two cases as described below.

Case 1

The Hamming weight of v is equal or smaller than a predefined maximal Hamming weight $K_{max}$. Where the Hamming weight refers to the number of non-zero bits in the vector v, i.e. bits equaling "1".

By definition of the KSoTT algorithm, after stage 1 the TT will contain a tuple<v,i>iff $F_j(v)$=1. It may be proved that stage 2 of the KSoTT algorithm removes only redundant literals. It may be assumed by contradiction that stage 2 of the KSoTT algorithm removes some irredundant literal $u_j$. The literal $u_j$ being irredundant implies that there exists a vector u with a Hamming weight of $K_{max}$ or smaller for which $F_i(u)$=1 and f((u\\$u_j$)∪¬ $u_j$)=0. This contradicts the condition of the reduction and therefore $u_j$ is not removed in the stage 2a of the KSoTT algorithm. If $u_j$ is removed in the stage 2a of the KSoTT algorithm then the vector u contains at most $K_{max}$−1 irredundant positive literals. Consequently, the vector u contains at least one redundant positive literal.

This again is a contradiction because as proved later in the present invention all redundant positive literals are removed in the stage 2a of the KSoTT algorithm. It is therefore proved that during the stage 2 of the KSoTT algorithm (which comprises stages 2a and 2b) no irredundant literals are removed.

Case 2

The Hamming weight of v is greater than the predefined maximal Hamming weight $K_{max}$.

For a function in $B_K$ there are at most $K_{max}$ irredundant bits in v. A vector v' is defined as shown in equation 3 below.

$$v' = (v'_1, \ldots, v'_{n+a}) \in \{0, 1\}^{n+a} \mid \qquad \text{Equation 3}$$

$$v'_j = \begin{cases} v_j: & v_j \text{ irredundant} \\ 0: & \text{otherwise} \end{cases}$$

The Hamming weight of v' is $K_{max}$ at most, hence as demonstrated in the previous section, after the stage 1 of the KSoTT algorithm f(v')=F(v')=F(v). It may be proved now that the stage 2 of the KSoTT algorithm removes all the redundant literals. Assuming by contradiction that the stage 2 of the KSoTT algorithm leaves some redundant literal $u_j$. The literal $u_j$ being redundant implies that for any vector u: $F_i(u)$=1iff f ((u')=(u\\$u_j$)∪¬ $u_j$)=1. If the Hamming weight of the vector u smaller than $K_{max}$ or if $u_j$=1, the Hamming weight of u' is smaller or equal to $K_{max}$. Hence, both <u,i> and <u',i> either appear or not in the truth table TT, which means that the literal $u_j$ is removed in the stage 2a of the KSoTT algorithm. If the Hamming weight of u is equal to $K_{max}$ and the literal $u_j$=0 the literal $u_j$ is removed in the stage 2b of the KSoTT algorithm. This again presents a contradiction. Finally, the correctness of the KSoTT algorithm may be proved for any function F. Let $F^0$=F⊗ $F_0$→$F^0$=0 and let $f^0$ be a reconstruction function for $F^0$. Developing the two equations with respect to the previous proofs produces F= $F^0$ ⊗ F(0)=$f^0$ ⊗ F(0) which is what had to be proven.

The number of probe iterations 104 in the KSoTT algorithm equals the number of elements in $\{0,1\}^{n+a}$ with the Hamming weight equal or smaller than $K_{max}$, i.e. the number of probe iterations 104 in the KSoTT algorithm is $$\sum_{i=0}^{K_{max}} \binom{N}{i} \leq 1 + N^{K_{max}}.$$

The run time of the KSoTT algorithm is therefore bound as expressed in equation 4 below.

$$T_{KSoTT} \leq O\left[\left(\frac{2n}{c} + 1\right)\left(1 + N^{K_{max}}\right)\right] \qquad \text{Equation 4}$$

The size of the truth table TT at the end of the stage 1 of the KSoTT algorithm defines the space requirement of the KSoTT algorithm. The truth table TT may be stored in the form of a sparse matrix, such that for every entry only bits equal to "1" in v are stored. In the worst case with respect to the memory space, every output bit depends on one input bit only. Hence, the bound for the memory space is expressed in equation 5 below.

$$S_{KSoTT} \leq O[K_{max}(n+b)(1+N^{K_{max}-1})] \qquad \text{Equation 5:}$$

In the domain of digital circuits, the number $K_{max}$ represents a bound on the transitive fan-in of the sequential elements and outputs of the circuit. For characterization of this parameter in typical digital circuits, the ITC'99 benchmark may be used for referring to collected statistics of the transitive fan-in numbers for internal flip-flops and external outputs.

Using the KSoTT algorithm, the process 100 yields a correct and compact disjunctive normal form (DNF) representation of the circuit S.

Figure 4:
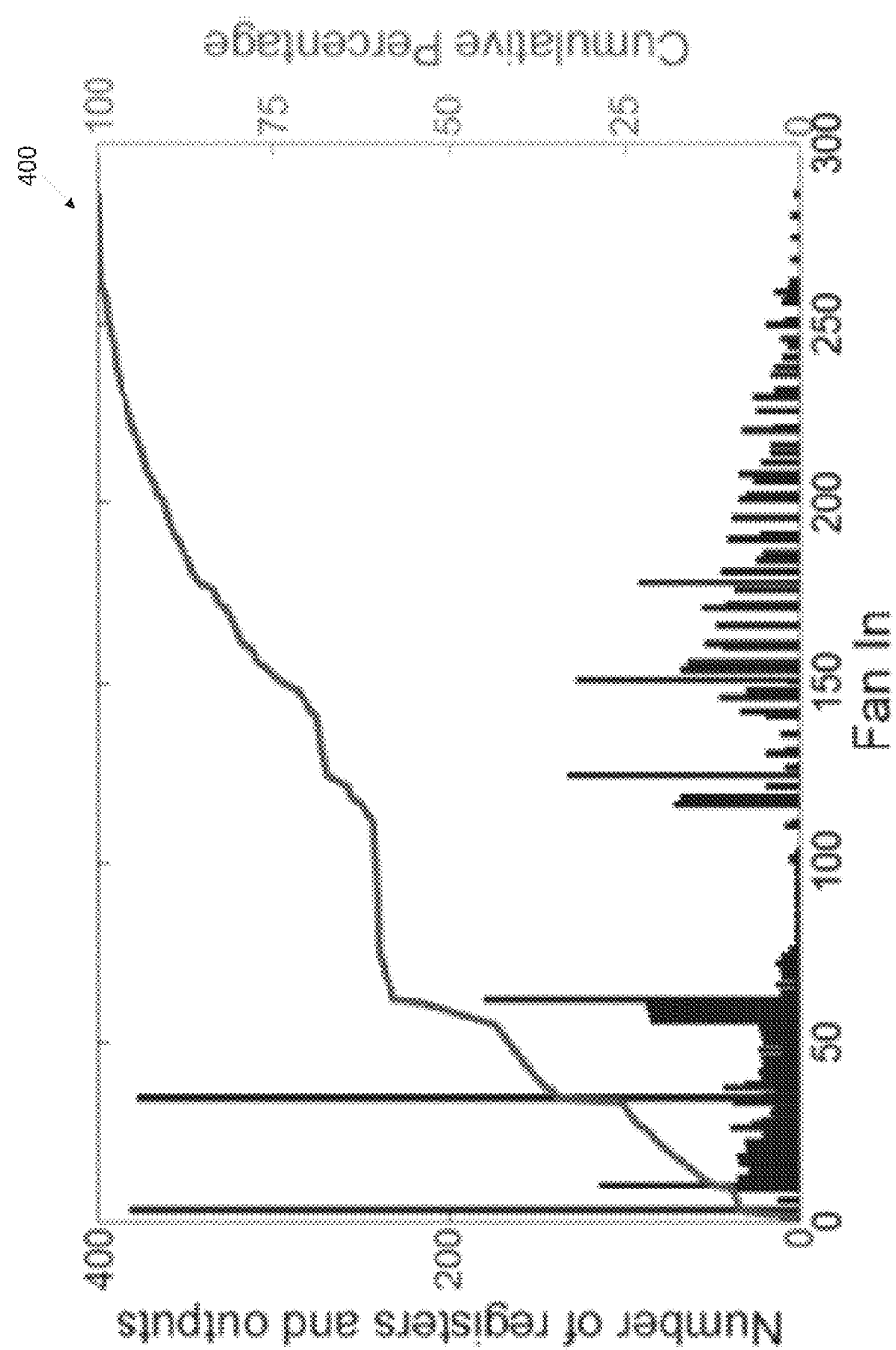
FIG. 4 is a graph presenting a cumulative histogram of transitive fan-ins of the flip-flops and the outputs in all 20 circuits from the ITC'99 benchmark set.

Reference is now made to FIG. 4, which is a graph presenting a cumulative histogram of transitive fan-ins of the flip-flops and the outputs in all 20 circuits from the ITC'99 benchmark set. As evident from a graph 400, for approximately half of the 20 circuits available in the ITC'99, the transitive fan-in value is smaller than 50, and for 25% of the circuits this parameter has a value smaller than 32. These statistics may be used to apply additional heuristic algorithms.

The KSoTT algorithm may be followed with an additional minimization step at the end. However, larger memory space may be required for the intermediate results, i.e. the truth table TT after the stage 1 of the KSoTT algorithm. In order to keep a compact structure of the truth table TT during the probing module 220 execution, the probing module 220 may remove redundant literals in runtime and/or perform partial minimization.

The runtime redundant literals removal may be accomplished using an additional heuristic algorithm, a compact K-bounded search over truth table (CSoTT). Given the digital circuit S compliant with the definition 1, the CSoTT algorithm is executed as pseudocode excerpt 3 below.

---

Pseudocode Excerpt 3:

```
F₀ = Probe(S, 0)
Onset[i] = 0 for all i from 1 to n + b
for k from 1 to K_max:
    for each v ∈ {0,1}^{n+a} | HammingWeight(v) = K
        P := Probe(S, v) ⊗ F₀
        M := ∧M_j | v_j = 1
        for i from 1 to n + b:
            if (P_i = 1)AND∄ m ∈ Onset[i] = reduction(M):
                add (Onset[i], v)
            else if (P_i = 0)
                call updateOnset(M, i)
        endfor
    endfor
endfor
```

---

The procedure updateOnset(M,i) is provided in code excerpt 4 below:

---

Pseudocode Excerpt 4:

```
Procedure updateOnset(M, i)
    for each m ∈ Onset[i] = reduction(M):
        for each m' = reduction(v) | m = reduction(m') :
            m_inv := ∧-m_n: for n | M_n = 1 AND m'≠ m_n
            m* := m'|| m_inv
            add (Onset[i], m*)
        endfor
    endfor
    remove (Onset[i], m)
end Procedure updateOnset
```

---

The CSoTT algorithm executed by the probing module 220 runs iteratively over vectors with an increasing Hamming weight, updating at each stage the per-output-bit table of implicants. A new implicant candidate is added to the table only if it is found irredundant. If an existing implicant candidate is found false, the implicant is removed from the table and replaced with updated implicants. The false implicant candidate is found when an implicant's expansion is found that produces a Probe result of 0. This iterative operation can be demonstrated using, for example, Karnaugh maps.

To demonstrate the operation of the CSoTT algorithm an example is presented. Tables 1, 2 and 3 below present Karnaugh maps created for an exemplary circuit implementing a single-bit function expressed in equation 6 below.

$$F(a,b,c,d) = (a \land \neg(b \land c)) \land c \land d \qquad \text{Equation 6:}$$

TABLE 1

| Stage 1: | | | | | |
|---|---|---|---|---|---|
| ab | cd | 00 | 01 | 11 | 10 |
| 00 | | 0 | 0 | 0 | 0 |
| 01 | | 0 | 0 | 0 | 0 |
| 11 | | 1 | 1 | 1 | 1 |
| 10 | | 1 | 1 | 1 | 1 | f = a

TABLE 2

| Stage 2: | | | | | |
|---|---|---|---|---|---|
| ab | cd | 00 | 01 | 11 | 10 |
| 00 | | 0 | 0 | 1 | 0 |
| 01 | | 0 | 0 | 1 | 0 |
| 11 | | 1 | 1 | 1 | 1 |
| 10 | | 1 | 1 | 1 | 1 | f = a ∨ c ∧ d

TABLE 3

| Stage 3 | | | | | |
|---|---|---|---|---|---|
| ab | cd | 00 | 01 | 11 | 10 |
| 00 | | 0 | 0 | 1 | 0 |
| 01 | | 0 | 0 | 1 | 0 |
| 11 | | 1 | 1 | 1 | 0 |
| 10 | | 1 | 1 | 1 | 1 | f = a ∧ b ∧ ¬c ∨ a ∧ ¬b ∧ c ∨ a ∧ ¬b ∧ ¬c ∨ c ∧ d = a ∧ ¬(b ∧ c) ∨ c ∧ d

The CSoTT algorithm is executed with $K_{max}=3$. At stage 1 of the CSoTT algorithm (as shown in table 1) with the Hamming weight=1, the only recorded implicant candidate is a. At stage 3 of the CSoTT algorithm (as shown in table 3) with the Hamming weight=3, this highlighted implicant candidate is found false, since the probe operation (probe iteration 104) on a test vector {a, b, c, d}=1110 yields a result of 0. Thus, the false implicant candidate (highlighted) is replaced with the more elaborate candidates as shown in the corresponding Karnaugh map for the stage 3.

Figure 5:
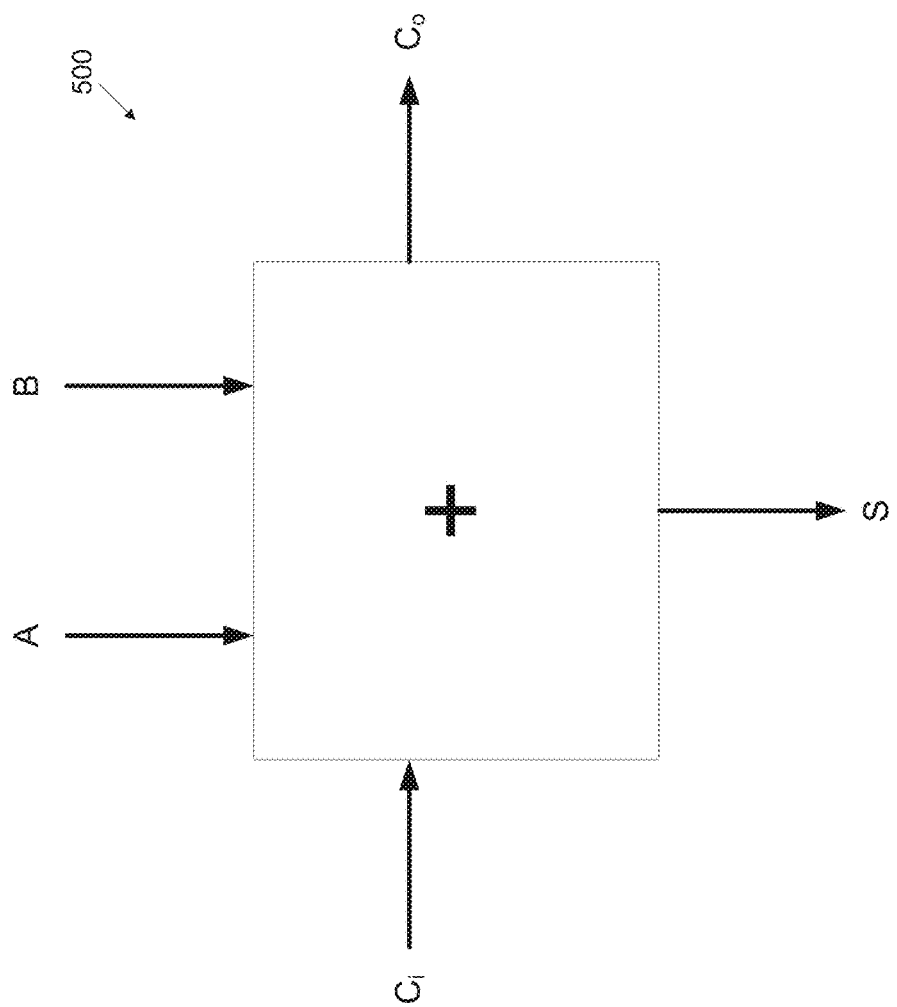
FIG. 5 is a schematic illustration of an exemplary full adder circuit.

Reference is now made to FIG. 5, which is a schematic illustration of an exemplary full adder circuit. An exemplary full adder 500 receives two inputs A and B along with a carriage input $C_i$ and generates an output S and a carriage output $C_o$. table 4 below presents the stages of the CSoTT algorithm applying an increasing Hamming weight.

TABLE 4

Stage 3: f = a∧b∧¬c∨a∧¬b∧c∨a∧¬b∧¬c∨c∧d = a∧¬(b∧c)∨c∧d

| Out | Hamming Weight = 1 | Hamming Weight = 2 | Hamming Weight = 3 |
|---|---|---|---|
| S | A<br>A, B<br>A, B, $C_i$ | A¬B, B¬A, $C_i$<br>A¬B¬$C_i$, B¬A, $C_i$¬A<br>A¬B¬$C_i$,<br>¬AB¬$C_i$,<br>¬A¬B$C_i$ | A¬B¬$C_i$,<br>¬AB¬$C_i$,<br>¬A¬B$C_i$,<br>AB$C_i$ |
| $C_o$ | ∅<br>∅<br>∅ | AB<br>AB, A$C_i$<br>AB, A$C_i$, B$C_i$ | AB, A$C_i$, B$C_i$ |

The Table 4 demonstrates the CSoTT algorithm stages with $K_{max}$=3. The columns designate the Hamming weight of the input vector v. Each column is split into stages indicating iterations over the vectors of the same Hamming weight. At the end of the CSoTT algorithm execution, the Onset table contains the minimal DNF representation of the full adder function.

The run time T of the CSoTT algorithm is equal to the run time of the KSoTT algorithm as expressed in equation 4.

The memory space S of the CSoTT algorithm is bound as expressed in equation 7 below.

$$S_{CSoTT} \leq O[K_{avg}(n+b)2^{K_{max}-1}] \qquad \text{Equation 7:}$$

Where $K_{avg}$ is the average transitive fan-in over all the n register and b output bits in the circuit S. In practice, it is expected that the memory space of CSoTT algorithm is slightly bigger than the size of the minimal DNF representation of the function F.

For both memory space and for run time of the CSoTT algorithm, selection of the appropriate K may be crucial. The $K_{max}$ of a typical circuit may be too high for the CSoTT algorithm to be applicable and/or practical. A lower value of K may be selected such that only part of the function F is accurately reconstructed.

A new metric $\delta_K$ may be defined for designate a circuit reconstruction accuracy, where the $\delta_K$ is a ratio between the number of correctly reconstructed bits and the total number of bits in the circuit. Based on the fan-in statistics of the ITC'99 benchmark circuits, an assessment may be made for the bound on the run time of the KSoTT or CSoTT algorithms required to achieve a specific accuracy.

Figure 6:
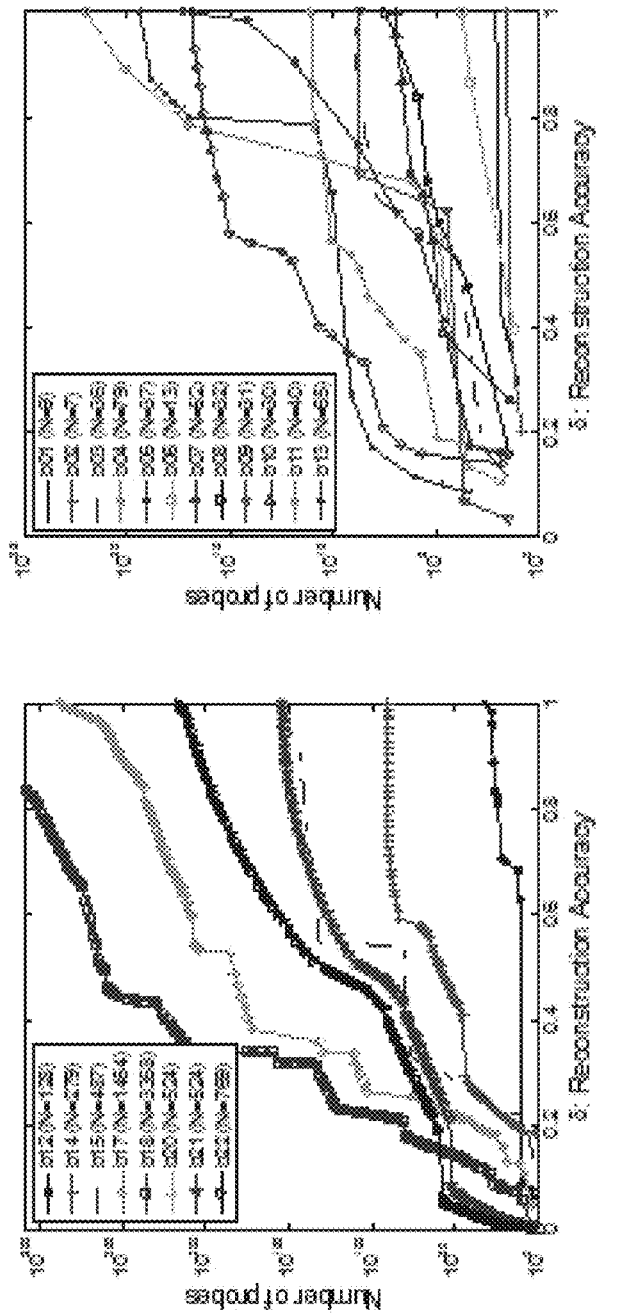
FIG. 6 is a graph presenting a circuit reconstruction accuracy for ITC'99 benchmark circuits, according to some embodiments of the present invention.

Reference is now made to FIG. 6, which is a graph presenting circuit reconstruction accuracy for ITC'99 benchmark circuits, according to some embodiments of the present invention. A graph (a) presents the circuit reconstruction accuracy for large ITC'99 circuits with respect to $K_{max}$. A graph (b) presents the circuit reconstruction accuracy for small ITC'99 circuits with respect to $K_{max}$. If the $K_{max}$ was constant, the run time may have increased in a polynomial manner with respect to the size of the circuit. However, from the fan-in statistics, we observe a sub-exponential run time increase that may indicate a dependence of the transitive fan-in statistics on the size of the circuit.

The probing module 220 may employ an additional heuristic algorithm, incremental K-bounded search over truth table (ISoTT). The ISoTT algorithm takes advantage of the fact that large digital circuits may typically not be flat structures. The large circuits are composed of hierarchical levels that combine parts of the circuit into 'dense' structures, in which the same sub-circuit may belong to a number of logical cones of different output bits. In particular, arithmetic circuits that include carry propagation are characterized as such. These circuits are characterized with a property that many implicants with K variables may be obtained by extension of the CSoTT algorithm from implicant candidates with an incremental Hamming weight K-$K_{step}$, where $K_{step}$ is a predefined value. Given the digital circuit S compliant with the definition 1, the ISoTT algorithm is executed as pseudocode excerpt 5 below.

Pseudocode Excerpt 5:

Pick $K_{init}$, $K_{step}$
Run CSoTT($K_{max}$ = $K_{init}$) on S
do:
    for each m ∈ Onset | HammingWeight(m) = $K_{init}$
        for each j | $m_j$ ∈ m: $v_j$ := 1
        Run CSoTT($K_{max}$ = $K_{step}$) on the remaining bits of v
    endfor
    $K_{init}$ := $K_{init}$ + $K_{step}$
while there is a change in Onset The ISoTT algorithm is a speculative algorithm and may adaptively generate the input vectors and/or the register input vectors. It implements a greedy best-first search method. The ISoTT algorithm may concentrate on creating input vectors and/or register input vectors that are estimated to provide significant contribution to mapping the logic function patterns in order to improve accuracy of the reconstruct logic function of the circuit(s). For example, the ISoTT algorithm may identify specific vectors that provided a significant contribution, for example, non-zero logic state at the external output pin(s). The ISoTT algorithm may then expand the identified specific vector(s) to higher Humming weight values. This of course, may not be done for every vector since the required computational resources may be impractical for mot circuits. Focusing only on the specific vectors may therefore provide a significant contribution while limiting the required computation resources. At every step of the ISoTT algorithm, the CSoTT algorithm is called as many times as the number of implicants with the maximum Hamming weight in the table. In the worst case from run time perspective, the performance of the ISoTT algorithm is similar to the performance of the CSoTT algorithm with $K_{init}$=$K_{max}$. For a more general case, the run time of a single algorithm step of the ISoTT algorithm may be expressed as shown in equation 8 below.

$$T_{ISoTT} \leq O[T_{ISoTT(step-1)} T_{CSoTT}(K_{max}=K_{step})] \qquad \text{Equation 8}$$

The performance of the ISoTT algorithm strongly depends on the structure of the circuit and on the size of the minimal DNF representation of the circuit. For some examples, such as arithmetic circuits, the ISoTT algorithm may achieve full reconstruction of the circuit. Experiments performed to validate the heuristic algorithms validity show that the ISoTT algorithm matches different circuit building blocks to different extent however for the benchmarks used for the concept validation, the ISoTT algorithm incremental steps add some reconstruction accuracy in a polynomial time.

Several experiments were conducted to validate the concepts presented herein the present invention.

A first experiment was carried out to demonstrate the correctness of the scan-based implementation of the scan insertion algorithm and the probe of the VLSI device using a probe such as the probe 210. For the experiment, a simple S was simulated. The circuit description is written in Verilog hardware description language (HDL) and is synthesized into gate level, followed by scan insertion. On the resulting gate-level obtained using the with the scan insertion algorithm as described for the process 100, the ESoTT algorithm was executed using a Verilog behavioral simulator. It should be noted that the ESoTT algorithm execution is preceded by a learning phase in which the length of the scan chain is learned by shifting a pattern into the scan input (shift in) and counting number of cycles until it is observed at the scan output (shift out).

Figure 7:
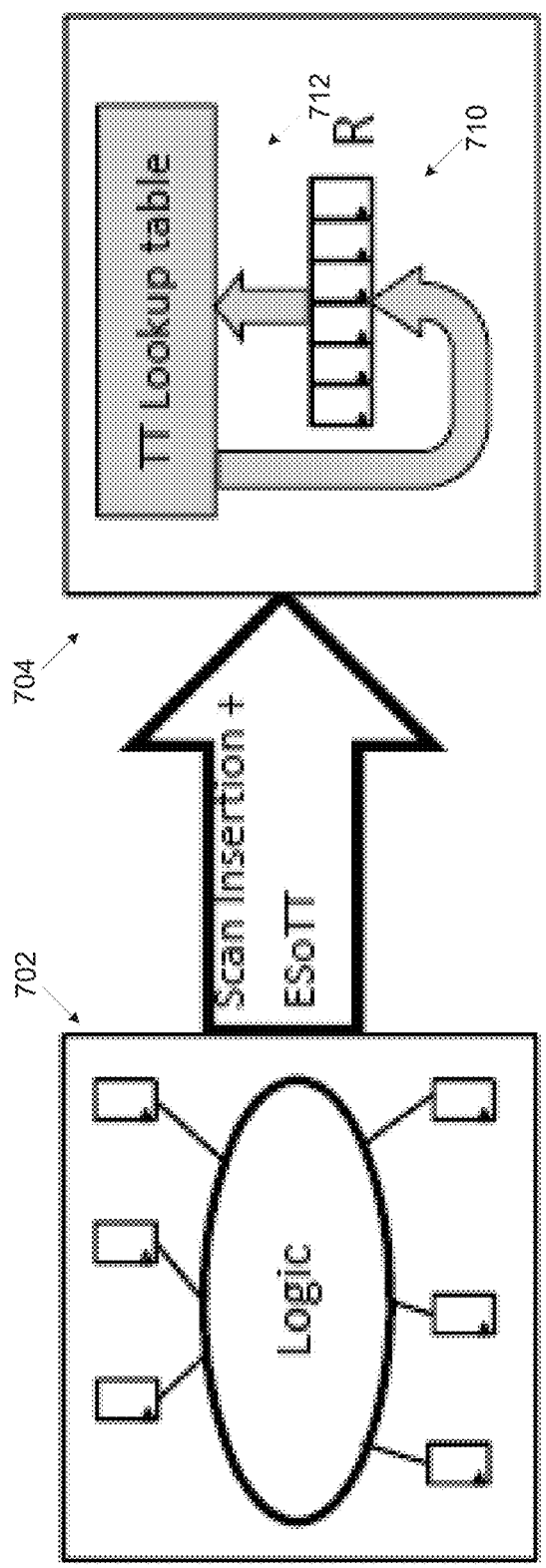
FIG. 7 is a schematic illustration demonstrating circuit reconstruction of a simple incrementing circuit using scan insertion algorithm, according to some embodiments of the present invention.

Reference is now made to FIG. 7, which is a schematic illustration demonstrating circuit reconstruction of a simple incrementing circuit using scan insertion algorithm, according to some embodiments of the present invention. A process such as the process 100 A was applied to a simple incrementing circuit S 702 in order to generate a circuit logic model by creating a reconstructed circuit S' 704. The reconstructed circuit S' 704 comprises a register R 710 comprising all n flip-flops found along the scan chain and a combinational function represented by a truth table look up table (LUT) 712 that covers all value combinations of the n flip-flops. Finally, the equivalence of the reconstructed circuit S' 704 to the original circuit S 702 was validated using a formal logic equivalence tool.

Additional experiments and simulations were performed to validate the concept of the heuristic algorithms. These experiments were developed for performance evaluation of the heuristic algorithms. The experiments run under a software simulator that works at the algorithmic level. Since the focus is on the algorithmic implementation the simulator models the circuit under test with a simulated probe function, abstracting away from the underlying scan based sequence executed using a probe such as the probe 210. The simulated probe function models the digital circuits under test with a probe operation, an operation that represents the circuit's next state function F compliant with the definition 1. The simulator also implements the heuristic algorithms. The output of the heuristic algorithm, i.e. the circuit reconstruction function $f$ (circuit logic model) is further matched against the original circuit function F. The simulator performs the matching by comparing the outputs of the functions F and $f$ for every possible input if the circuit is not too large. If the circuit size is too large for checking all the values, the simulator performs the matching using statistical method with a sufficiently large sample set of randomly selected inputs.

Both the ESoTT and the KSoTT algorithms require deterministic runtime and space, thus, they may be calculated. Therefore, in the graphs presented herein after analytical data for these the ESoTT and the KSoTT algorithms are provided. For the CSoTT and ISoTT algorithms, simulation results are presented. In addition, for the ISoTT algorithms a series of runs were performed with different $K_{init}$ and $K_{step}$ parameters and the best results were selected for constructing the graphs.

During the first experiment for evaluating the heuristic algorithms, the heuristic algorithms were applied to common building blocks of the digital circuits such as arithmetic circuits, for example, adder and multiplier blocks as representative members of the arithmetic circuits family. In this experiment, the run time and space required to achieve a full reconstruction ($\delta=1$) were checked. While the arithmetic circuits are characterized by tight dependency making the limited fan-in optimization non-efficient, the arithmetic circuits have a regular and recursive structure that is a useful property for the incremental ISoTT algorithm.

Figure 8:
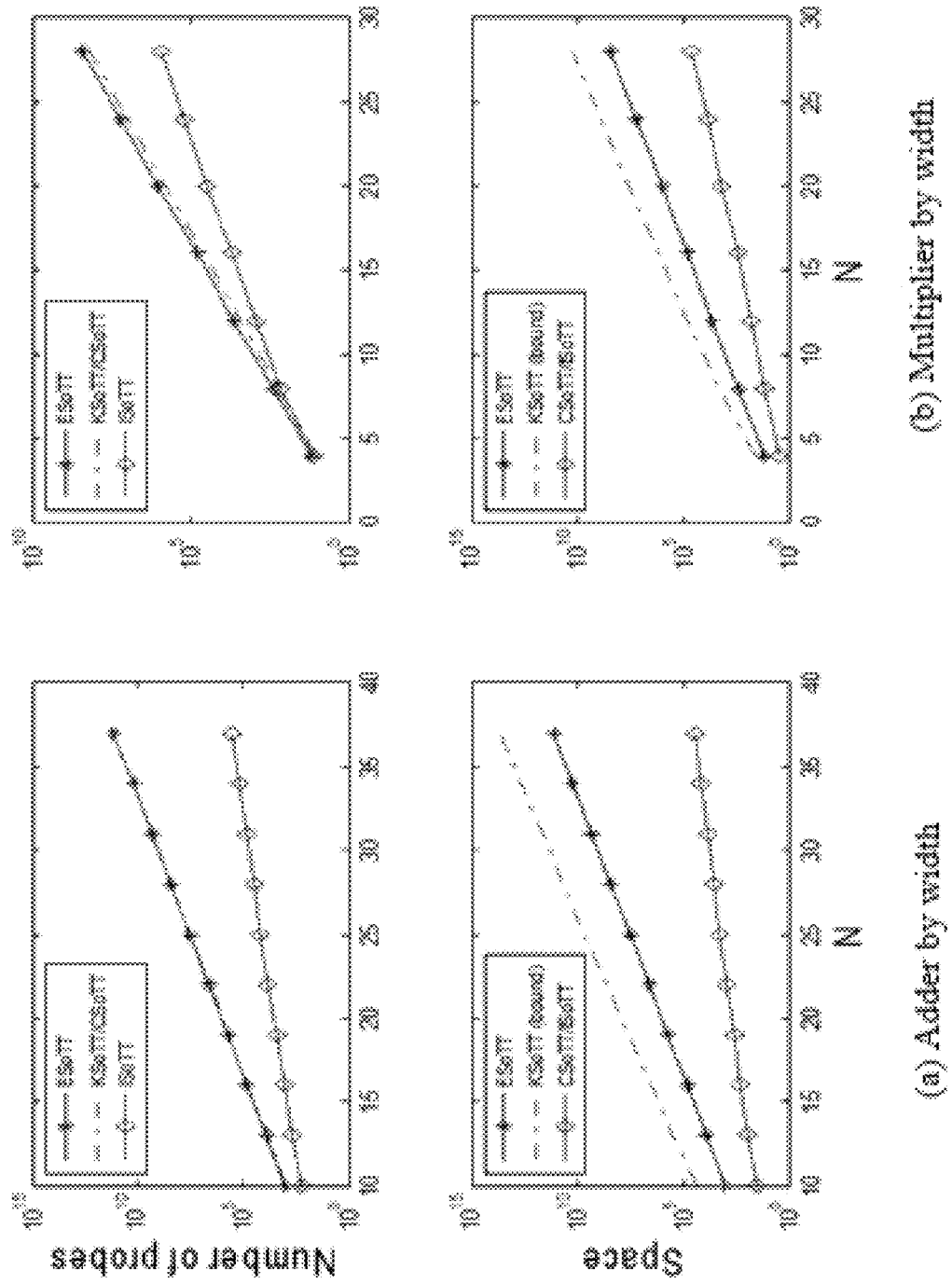
FIG. 8 is a graph presenting a comparison of number of probe iterations and memory space consumption for several heuristic algorithms for an adder circuit and a multiplier circuit, according to some embodiments of the present invention.

Reference is now made to FIG. 8, which is a graph presenting a comparison of number of probe iterations and memory space consumption for several heuristic algorithms for an adder circuit and a multiplier circuit, according to some embodiments of the present invention. As discussed before N represents the sum of the internal register(s) bits and the external input pins such that N=n+a. As shown, for both the adder and the multiplier, the KSoTT algorithm does not present an advantage over the ESoTT algorithm (exhaustive search), neither in run time (number of probe iterations) nor in space consumption. The CSoTT algorithm does present improvement in the space consumption for both the adder and the multiplexer circuits.

The ISoTT algorithm however presents a major improvement for the adder circuit, both in the run time (number of probe iterations) and in the space consumption. For the multiplier circuit the ISoTT algorithm provides a less significant improvement over the naïve algorithms, mainly the ESoTT algorithm. This results from the circuit size of the multiplier circuit that grows exponentially with the number of bits. Since the run time of the ISoTT algorithm is proportional to the size of the circuit, the ISoTT algorithm may be less effective for the large circuits. It should be noted that KSoTT algorithm and the CSoTT algorithm require the same number of probes. The ISoTT algorithm as an extension of the CSoTT algorithm has the same space requirements as the CSoTT algorithm. As evident from the experiment, the heuristic algorithms present only limited advantages over the ESoTT algorithm for the adder circuit and the multiplier circuit that are single function circuits in which the limited fan-in approach has little advantage.

An additional experiment was performed for a pipelined accumulator circuit. It is expected that the advantage of the limited fan-in approach is more evident for hierarchical structures having loose dependencies between their substructures, for example, the pipelined accumulator circuit. The pipelined accumulator circuit is built of a few pipeline stages where every stage takes the result of the previous stage, adds it to the input vector, and supplies the result to the next stage. When unfolded to a combinational structure, the pipelined accumulator circuit turns to a set of adders in a parallel construction.

Figure 9:
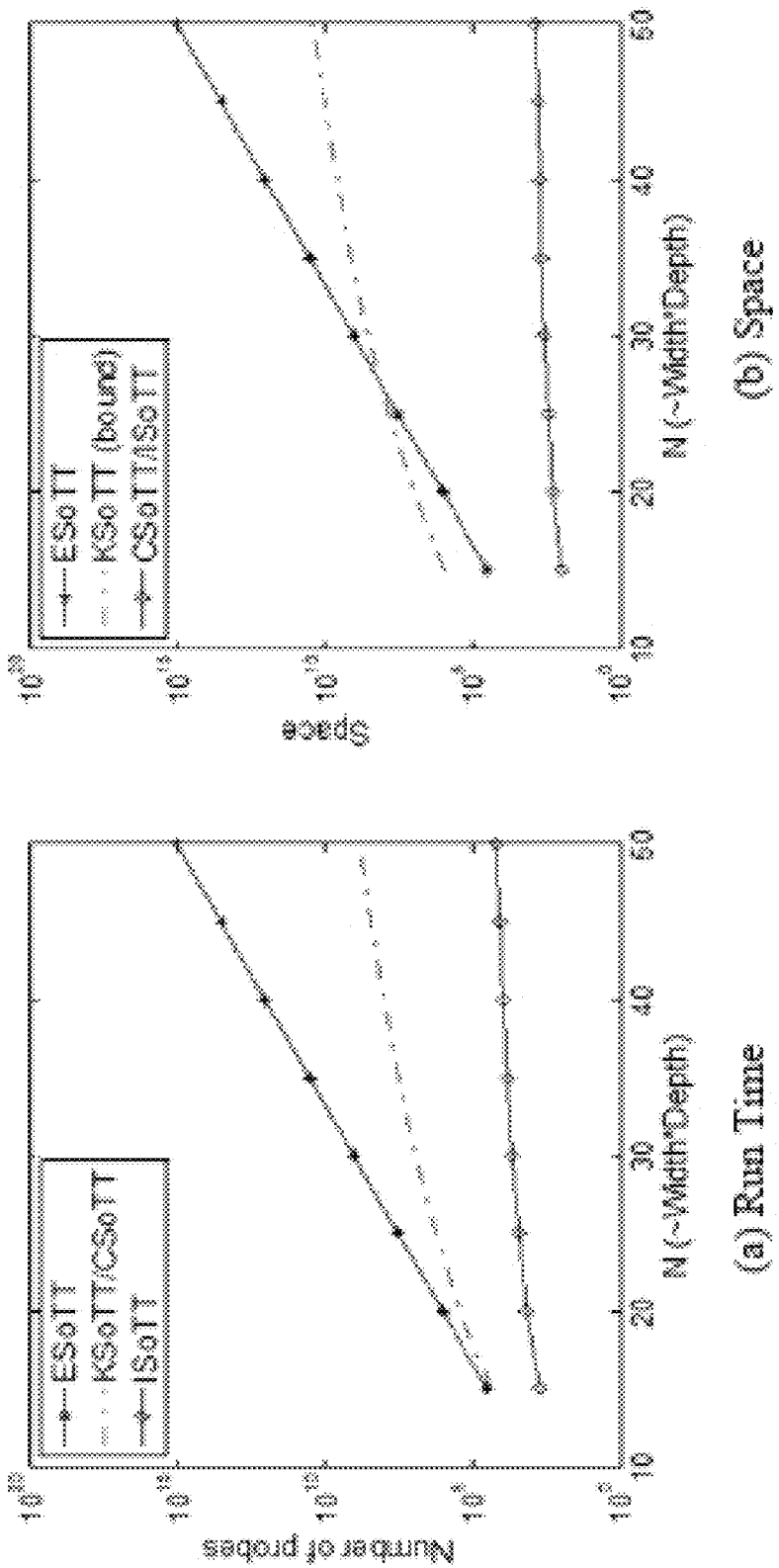
FIG. 9 is a graph presenting a comparison of number of probe iterations and memory space consumption for several heuristic algorithms for a pipelined accumulator circuit, according to some embodiments of the present invention.

Reference is now made to FIG. 9, which is a graph presenting a comparison of number of probe iterations and memory space consumption for several heuristic algorithms for a pipelined accumulator circuit, according to some embodiments of the present invention. The value of $K_{max}$ is derived from the size of the single adder and does not depend on the number of pipeline stages. Therefore, a polynomial increase is observed in the space and run time of the heuristic algorithms.

In another experiment, the heuristic algorithms are evaluated for a multiplexer that is a typical element of data path structures, for example, unfolding a register file with the scan insertion algorithm results in a structure resembling a multiplexer. The size of the input vector to the multiplexer with bus width W and rank (number of input busses) R is N=R*W. Every output bit of the multiplexer depends only on R+$Log_2$R bits. In other words, $K_{max}$ does not depend on the bus width. This makes all the heuristic algorithms, which use the limited fan-in property, particularly efficient for wide data path structures.

Figure 10:
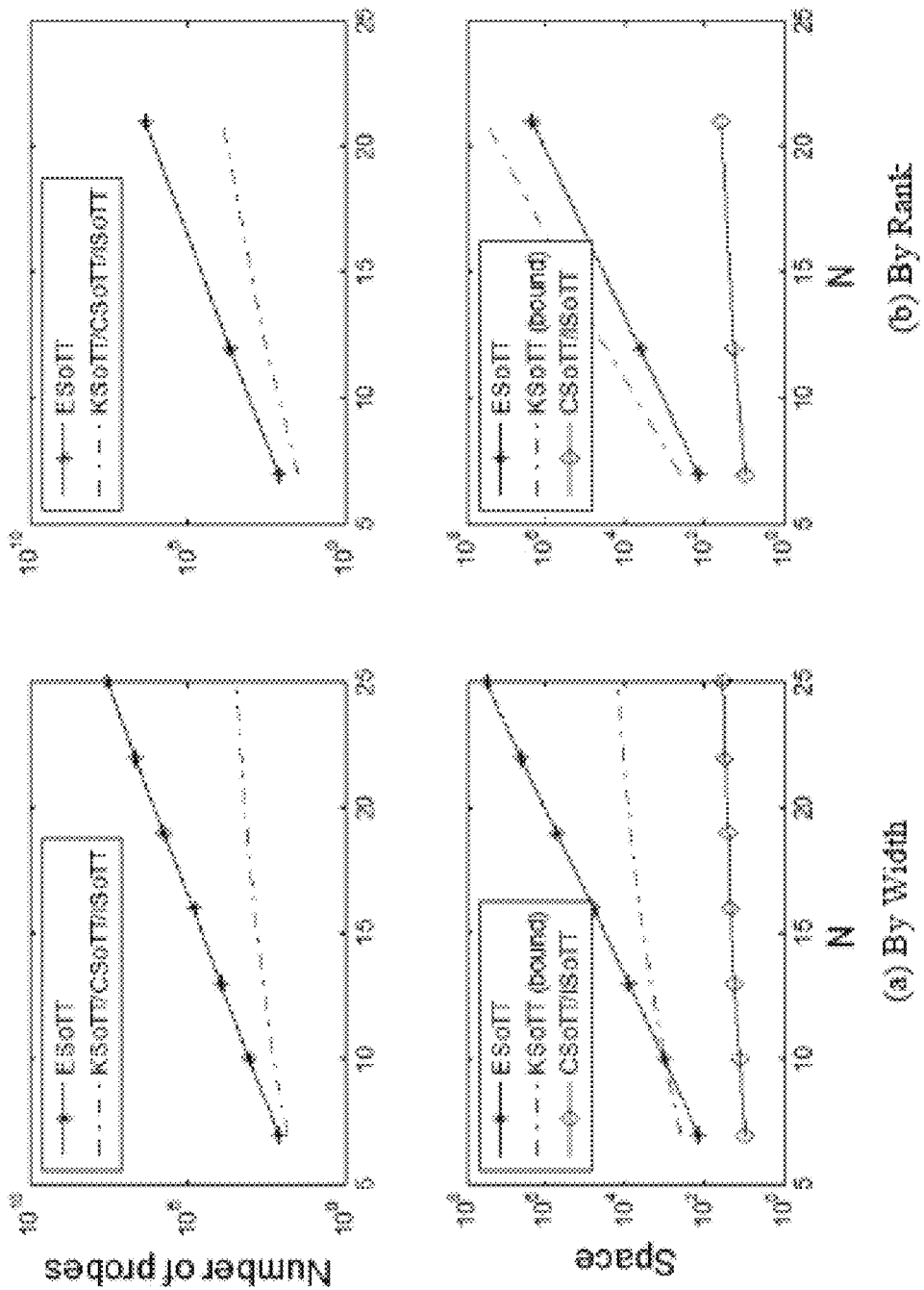
FIG. 10 is a graph presenting a comparison of number of probe iterations and memory space consumption for several heuristic algorithms for a multiplexer circuit, according to some embodiments of the present invention.

Reference is now made to FIG. 10, which is a graph presenting a comparison of number of probe iterations and memory space consumption for several heuristic algorithms for a multiplexer circuit, according to some embodiments of the present invention. As shown the heuristic algorithms present significant improvement over the ESoTT algorithm as expected. An additional observation is that ISoTT algorithm does not present any advantage over the CSoTT for the multiplexer circuit.

The previous experiments considered well-structured and regular circuits and demonstrated that the heuristic algorithms take advantage of their regularity. Naturally, the more structure (or less entropy) is present in the circuit, the better the limited transitive fan-in property can be exploited by the heuristic algorithms. An experiment was conducted on an advanced encryption standard (AES) S-box regarded as an example of a circuit with high entropy to evaluate the heuristic algorithms dependency on circuit entropy. As expected none of the heuristic algorithms performed better than the ESoTT algorithm. Interestingly, the ISoTT algorithm yielded accurate response (6=1) for the AES. The explanation is in sensitivity (avalanche effect) of the S-box function. That is, any input bit change, no matter the state of the other bits, causes a change in the output. Therefore, the ISoTT algorithm eventually explores the whole search space. It should be noted that when the circuit comprises two or more AES S-boxes, the entropy declines, and the advantage of the CSoTT algorithm may be observed.

In yet another experiment four circuits b03 (N=36), b04 (N=79), b05 (N=37) and b14 (N=279) from the ITC'99 benchmark set were selected for further evaluation of the heuristic algorithms. The circuit descriptions were translated from VHSIC hardware description language (VHDL) to a software model and integrated with the simulator. The CSoTT algorithm and the ISoTT algorithm were applied to the selected circuits and the resulting reconstruction accuracy was checked with respect to the number of probe iterations (N).

Figure 11:
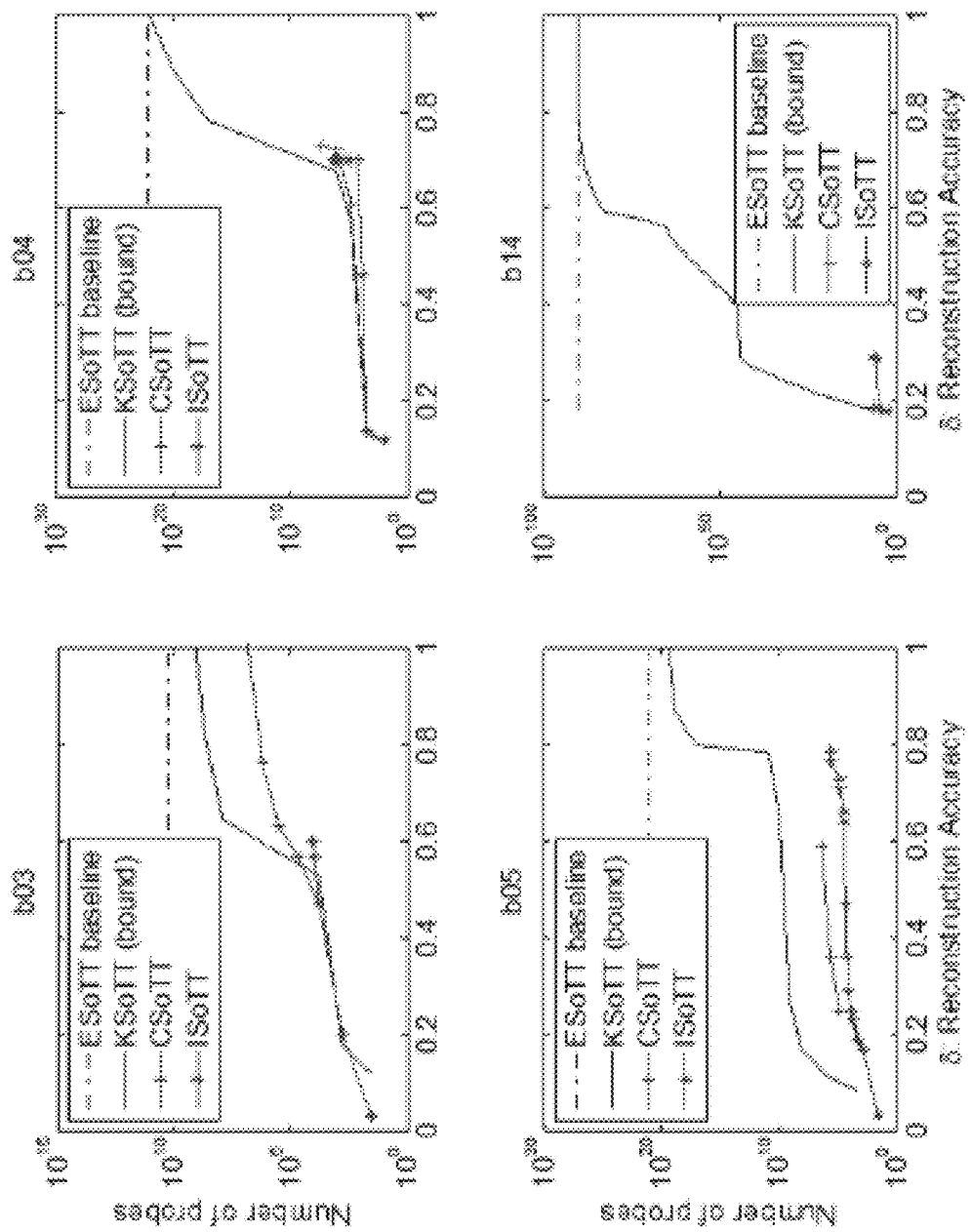
FIG. 11 is a graph presenting a comparison of number of probe iterations and memory space consumption for several heuristic algorithms for a four circuits selected from the ITC'99 benchmark set, according to some embodiments of the present invention.

Reference is now made to FIG. 11, which is a graph presenting a comparison of number of probe iterations and memory space consumption for several heuristic algorithms for a four circuits selected from the ITC'99 benchmark set, according to some embodiments of the present invention. As shown for all the selected circuits, and especially for b03 and b05, the CSoTT algorithm performance is better than the calculated bound. The reason for that is that the actual run time depends on the size of the maximum minterm, which is usually lower than total number of variables affecting a single output bit. The ISoTT algorithm consistently presented the best performance in all the tested circuits. The run time of the ISoTT algorithm increases in a super-linear way with the reconstruction accuracy until it reaches a point, where it exhausts all the paths containing a solution. At this point the ISoTT algorithm stops. For example, in b14 that is the biggest circuit out of the four selected circuits, where the KSoTT algorithm calculated run time and the CSoTT algorithm simulated run time grow very fast, ISoTT algorithm is able to gain an additional 10% in the reconstruction accuracy.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant systems, methods and computer programs will be developed and the scope of the term commerce information and price is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A computerized method of creating a circuit logic model of a very large scale integration (VLSI) device, comprising:
    mapping a plurality of logic function patterns of at least one circuit of a VLSI device through a plurality of probe iterations, each probe iteration comprising:
        switching between a scan shift mode and a functional mode of said VLSI device such that
        while said VLSI device operates in said scan shift mode at least one register associated with said at least one circuit is accessed, and
        while said VLSI device operates in said functional mode at least one external pin of said VLSI device associated with said at least one circuit is probed,
        mapping a respective one of said plurality of logic function patterns according to a logic state of: at least one bit in said at least one register and said at least one external pin; and
    generating a circuit logic model of said at least one circuit by reconstructing a logical function of a combinatorial logic of said at least one circuit based on an analysis of said plurality of logic function patterns;
    wherein the circuit logic model is provided for manufacturing the VLSI device.

2. The method of claim 1, wherein said mapping includes creating a truth table comprising said plurality of logic function patterns.

3. The method of claim 1, wherein a number of said plurality of probe iterations depends on a number of a plurality of test vectors each comprising a sequence of logic states of at least one of at least one bit in said at least one register and at least one external input pin of said at least one external pin, said number of a plurality of test vectors is bound by a maximal number being a sum of a number of bits in said at least one register and a number of external input pins of said at least one external pin.

4. The method of claim 1, wherein said access includes at least one of: setting a logic value to said at least one bit and reading a logic value of said at least one bit,
    wherein said setting and said reading is done through a scan test interface of said VLSI device.

5. The method of claim 4, wherein said setting is done by driving a register input vector including a number of bits equal to a number of said at least one bit, and
    said reading is done by retrieving a register output vector including a number of bits equal to a number of said at least one bit.

6. The method of claim 1, wherein said probe includes at least one of: setting a logic value to at least one external input pin of said at least one external pin and reading a logic value of at least one external output pin of said at least one external pin.

7. The method of claim 6, wherein said setting is done by applying an input vector including a number of bits equal to a number of said at least one external input pin, and said reading is done by probing an output vector including a number of bits equal to a number of said at least one external output pin.

8. The method of claim 1, further comprising reducing a number of said plurality of probe iterations by reducing a number of a plurality of test vectors each applied to said VLSI device during a respective one of said plurality of probe iterations,
    wherein each of said plurality of test vectors comprises a sequence of logic states of at least one of at least one bit in said at least one register and at least one external input pin of said at least one external pin,
    said number of said plurality of test vectors is reduced by selecting selected test vectors from said plurality of test vectors having a Hamming weight lower than a maximal Hamming weight defining a number of bits which are not equal to zero,
    wherein said maximal Hamming weight implies a precision level of said circuit logic model.

9. The method of claim 8, further comprising reducing said number of said plurality of probe iterations by applying an incremental Hamming weight to said plurality of test vectors.

10. The method of claim 8, further comprising reducing said number of said plurality of probe iterations by selectively expanding a limited number of significant test vectors of said plurality of test vectors, said significant test vectors presented a significant logic function pattern during at least one previous probe iteration of said plurality of probe iterations.

11. The method of claim 1, further comprising reducing computation resources for said analysis by considering each of said plurality of logic functional patterns only in case said each logic function pattern is a minterm having a result value of logic "1".

12. The method of claim 11, further comprising reducing computation resources for said analysis by removing at least one redundant logic function pattern of said plurality of logic function patterns,
    said at least one redundant logic function pattern provides no additional information on said logic function over information provided by at least one previous logic function pattern created during at least one previous probe iteration of said plurality of probe iterations.

13. A system for generating a circuit logic model of a VLSI device, comprising:
a probe connected to a scan test interface of a VLSI device;
a program store for storing a code;
at least one processor coupled to said probe and said program store for executing said code, said code comprising:
code instructions to map a plurality of logic function patterns of at least one circuit of said VLSI device through a plurality of probe iterations, each probe iteration comprising:
switching between a scan shift mode and a functional mode of said VLSI device such that
while said VLSI device operates in said scan shift mode at least one register associated with said at least one circuit is accessed, and
while said VLSI device operates in said functional mode at least one external pin of said VLSI device associated with said at least one circuit is probed,
mapping a respective one of said plurality of logic function patterns according to a logic state of: at least one bit in said at least one register and said at least one external pin; and
code instructions to generate a circuit logic model of said at least one circuit by reconstructing a logical function of a combinatorial logic of said at least one circuit based on an analysis of said plurality of logic function patterns;
wherein the circuit logic model is provided for manufacturing the VLSI device.

14. The system of claim 13, wherein said mapping includes creating a truth table comprising said plurality of logic function patterns.

15. The system of claim 13, wherein a number of said plurality of probe iterations depends on a number of a plurality of test vectors each comprising a sequence of logic states of at least one of at least one bit in said at least one register and at least one external input pin of said at least one external pin, said number of a plurality of test vectors is bound by a maximal number being a sum of a number of bits in said at least one register and a number of external input pins of said at least one external pin.

16. The system of claim 13, wherein said access includes at least one of: setting a logic value to said at least one bit and reading a logic value of said at least one bit,
wherein said setting and said reading is done through a scan test interface of said VLSI device.

17. The method of claim 16, wherein said setting is done by driving a register input vector including a number of bits equal to a number of said at least one bit, and
said reading is done by retrieving a register output vector including a number of bits equal to a number of said at least one bit.

18. The system of claim 13, wherein said probe includes at least one of: setting a logic value to at least one external input pin of said at least one external pin and reading a logic value of at least one external output pin of said at least one external pin.

19. The method of claim 18, wherein said setting is done by applying an input vector including a number of bits equal to a number of said at least one external input pin, and said reading is done by probing an output vector including a number of bits equal to a number of said at least one external output pin.

* * * * *